(12) United States Patent
Vadi et al.

(10) Patent No.: US 7,314,174 B1
(45) Date of Patent: Jan. 1, 2008

(54) METHOD AND SYSTEM FOR CONFIGURING AN INTEGRATED CIRCUIT

(75) Inventors: Vasisht Mantra Vadi, San Jose, CA (US); David P. Schultz, San Jose, CA (US); Steven P. Young, Boulder, CO (US); Jennifer Wong, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 469 days.

(21) Appl. No.: 10/970,964

(22) Filed: Oct. 22, 2004

(51) Int. Cl.
- *G06K 7/10* (2006.01)
- *G06K 9/36* (2006.01)
- *G06K 9/80* (2006.01)

(52) U.S. Cl. .............. 235/462.1; 235/462.09; 235/462.01

(58) Field of Classification Search ........... 235/462.1, 235/462.09, 462.07, 462.01, 460; 326/38–39, 326/41, 47
See application file for complete search history.

(56) References Cited

U.S. PATENT DOCUMENTS

| | | | | |
|---|---|---|---|---|
| 5,821,772 A | * | 10/1998 | Ong et al. ................ 326/38 |
| 5,892,961 A | * | 4/1999 | Trimberger ............... 712/10 |
| 6,140,839 A | * | 10/2000 | Kaviani et al. ............ 326/39 |
| 6,204,687 B1 | | 3/2001 | Schultz et al. |
| 6,429,682 B1 | | 8/2002 | Schultz et al. |
| 6,496,971 B1 | * | 12/2002 | Lesea et al. ............... 716/16 |
| 7,088,134 B1 | * | 8/2006 | Agrawal et al. ............ 326/41 |
| 2001/0038297 A1 | * | 11/2001 | Or-Bach .................. 326/41 |
| 2006/0255833 A1 | * | 11/2006 | Singh et al. ............... 326/41 |

OTHER PUBLICATIONS

U.S. Appl. No. 10/377,857, filed Feb. 28, 2003, Blodget et al.
U.S. Appl. No. 10/796,750, filed Mar. 8, 2004, Vadi et al.
U.S. Appl. No. 10/836,722, filed Apr. 30, 2004, Vadi et al.
U.S. Appl. No. 10/971,394, filed Oct. 22, 2004, Vadi et al.
Xilinx, Inc.; Application Note: Virtex Series; XAPP151 (v1.7); "Virtex Series Configuration Architecture User Guide", Oct. 20, 2004; available from Xilinx, Inc., 2100 Logic Drive, San Jose, CA 95124; pp. 1-45.

* cited by examiner

*Primary Examiner*—Thien M. Le
*Assistant Examiner*—Edwyn Labaze
(74) *Attorney, Agent, or Firm*—Kim Kanzaki

(57) ABSTRACT

A system for programming configuration memory cells in an integrated circuit. The system includes: a set of data registers, wherein a member of the set has a temporary storage for a fixed number of configuration bits; and a plurality of rows, each row has a plurality of columns, wherein configuration memory cells in a selected column and in a selected row are programmed using the fixed number of configuration bits.

16 Claims, 16 Drawing Sheets

METHOD AND SYSTEM FOR CONFIGURING AN INTEGRATED CIRCUIT

FIELD OF THE INVENTION

The present invention relates generally to Integrated Circuits and more specifically, to programming the configuration memory on an integrated circuit.

BACKGROUND

FIG. 1 is a split-level perspective view showing a simplified representation of a type of PLD, e.g., a Field Programmable Gate Array (FPGA) 100. Similar to most integrated circuits, FPGA 100 includes programmable circuitry formed on a semiconductor substrate that is housed in a package having externally accessible pins. In order to provide a simplified explanation of how an FPGA is configured, FPGA 100 is functionally separated into a configuration plane 120 and a logic plane 150.

Configuration plane 120 generally includes a configuration circuit 122 and configuration memory array 125. Configuration circuit 122 includes several input and/or output terminals that are connected to dedicated configuration pins 127 and to dual-purpose input/output (I/O) pins 128. Configuration memory array 125 includes memory cells, e.g., 126-1 and 126-2 that are arranged in "frames" (i.e., columns of memory cells extending the length of FPGA 100), e.g., column 140, and column addressing circuitry (not shown) for accessing each frame. JTAG (Boundary Scan) circuitry 130 is included in configuration plane 120, and is also connected to at least one terminal of configuration circuit 122. JTAG circuit 130 includes the four well-known JTAG terminals 133 (i.e., TDI, TDO, TMS, and TCK). During configuration of FPGA 100, configuration control signals are transmitted from dedicated configuration pins 127 to configuration circuit 122. In addition, a serial configuration bit stream is transmitted from either the TDI terminal of JTAG circuit 130, or from dual-purpose I/O pins 128 or a parallel configuration bitstream from the SelectMAP interface (not shown) to configuration circuit 122. During a configuration operation, configuration circuit 122 routes configuration data from the bit stream to memory array 125 to establish an operating state of FPGA 100. For self-reconfiguration and partial reconfiguration an internal control access port (ICAP) 132 is used for a first portion of the FPGA 100 to reconfigure a second portion of the FPGA 100.

Programmable logic plane 150 includes CLBs arranged in rows and columns, IOBs surrounding the CLBs, and programmable interconnect resources including interconnect lines 152 and multi-way switch boxes 153 (indicated by rectangles) that are connected between the rows and columns of CLBs. During normal operation of FPGA 100, logic signals are transmitted from dual-purpose pins 128 and/or device I/O pins 155 through the IOBs to the interconnect resources, which route these signals to the CLBs in accordance with the configuration data stored in memory array 125. The CLBs perform logic operations on these signals in accordance with the configuration data stored in memory array 125, and transmit the results of these logic operations to dual-purpose pins 128 and/or device I/O pins 155. In addition to the CLBs, programmable logic plane 150 includes dedicated random-access memory blocks (BLOCK RAM) that are selectively accessed through the interconnect resources. Other programmable logic plane resources, such as clock resources, multipliers, and so forth, are omitted from FIG. 1 for brevity. Further details may be found in U.S. Pat. No. 6,204,687, filed Aug. 13, 1999, entitled "Method and Structure for Configuring FPGAs", by David P. Schultz, et al.

FIG. 2 illustrates a simplified frame arrangement for some configuration memory cells, for example, 126-1 and 126-2, of the configuration plane 120 of FPGA 100. FIG. 2 shows six columns 214, 216, 218, 220, 222, and 224 of configuration memory cells, a frame data register (FDR) 210, and a column address decoder 212. A frame, such as in column 216 may included configuration memory cells shown in column 140 of FIG. 1. The configuration circuit 122 in FIG. 1 includes the FDR 210. The FDR 210 is a large shift register in which a frame of configuration data is serially shifted. To configure, for example, the configuration memory cells in column 216, first, the bit stream data is shifted into FDR 210; next, the column address decoder 212 will select column 216; and lastly, the contents of FDR 210 are transferred in parallel to column 216. Further details on FGPA configuration using frames are well known and can be found in, for example, the Virtex-II Pro Platform FPGA Handbook by Xilinx, Inc. of San Jose Calif., October 2002.

One disadvantage with using conventional frames in FIG. 2 to program the configuration memory cells is that as the amount of programmable logic and programmable interconnects on the PLD changes, so does the frame size, which may vary, for example, from under 1000 bits to over 10,000 bits. Thus, as the FDR length and the column lengths are variable depending upon the size of the part, the design is not very scalable.

Another disadvantage is that frames are addressable in FIG. 2 by a one-dimensional column address. For reconfiguration this means that a whole column must be changed in order to reconfigure a portion of the column. The disadvantage gets worse as the size of the part gets larger, and the columns increase in length.

Therefore, there is a need for an improved configuration design, which is scaleable, and is better for reconfiguration.

SUMMARY

The present invention relates generally to a method and system for configuring an Integrated Circuit (IC), having programmable logic and programmable interconnections, using a multi-dimensional set of configuration data. The multi-dimensional set of configuration data includes a plurality of groups of bits for programming configuration memory cells, where each group of bits has a two or more dimensional address in a configuration memory array of the IC. In one exemplary embodiment of the present invention, each group of bits is a fixed length, i.e., a fixed frame, and each fixed frame may program a portion of the configuration memory array located at a selected (x, y) or (row, column) address. In a further embodiment, a fixed length frame data register (FDR) for that row, may be selected by asserting an address signal.

An embodiment of the present invention provides a system for programming configuration memory cells in an IC, for example, a programmable logic device (PLD). The system includes: a set of data registers, wherein a member of the set has temporary storage for a fixed number of configuration bits; and a plurality of rows, where each row has a plurality of columns, and wherein configuration memory cells in a selected column and in a selected row are programmed using the fixed number of configuration bits.

Another embodiment of the present invention provides a system for programming configuration memory cells in a programmable logic device (PLD). The system includes: a plurality of groups of configuration memory cells arranged in a plurality of rows and a plurality of columns, where a group stores a fixed length frame and is associated with a row address and a column address; a plurality of column address decoder circuits, where each column address decoder circuit is associated with a row, and wherein a column address decoder circuit is configured to produce the column address for the group; and a plurality of frame data registers, where each frame data register has a plurality of data registers, and wherein a frame data register is used to store the fixed length frame.

A further embodiment of the present invention includes a method for programming memory cells in an integrated circuit. First, a row is selected in a configuration memory array; next, a data register receives configuration data for a column in the row; then the configuration data is written from the data register to the configuration memory cells in the row; and lastly, configurable logic is programmed using at least some of the configuration memory cells.

Another embodiment of the present invention includes a method for reading configuration memory cells in an integrated circuit. The method includes selecting a row in a configuration memory array using a row address, where the configuration memory array is for programming configurable logic and interconnections. Next, a data register receives configuration data for a column in the row; and the configuration data is read from the data register by the configuration circuit.

The present invention will be more full understood in view of the following description and drawings.

DETAILED DESCRIPTION

Figure 1:
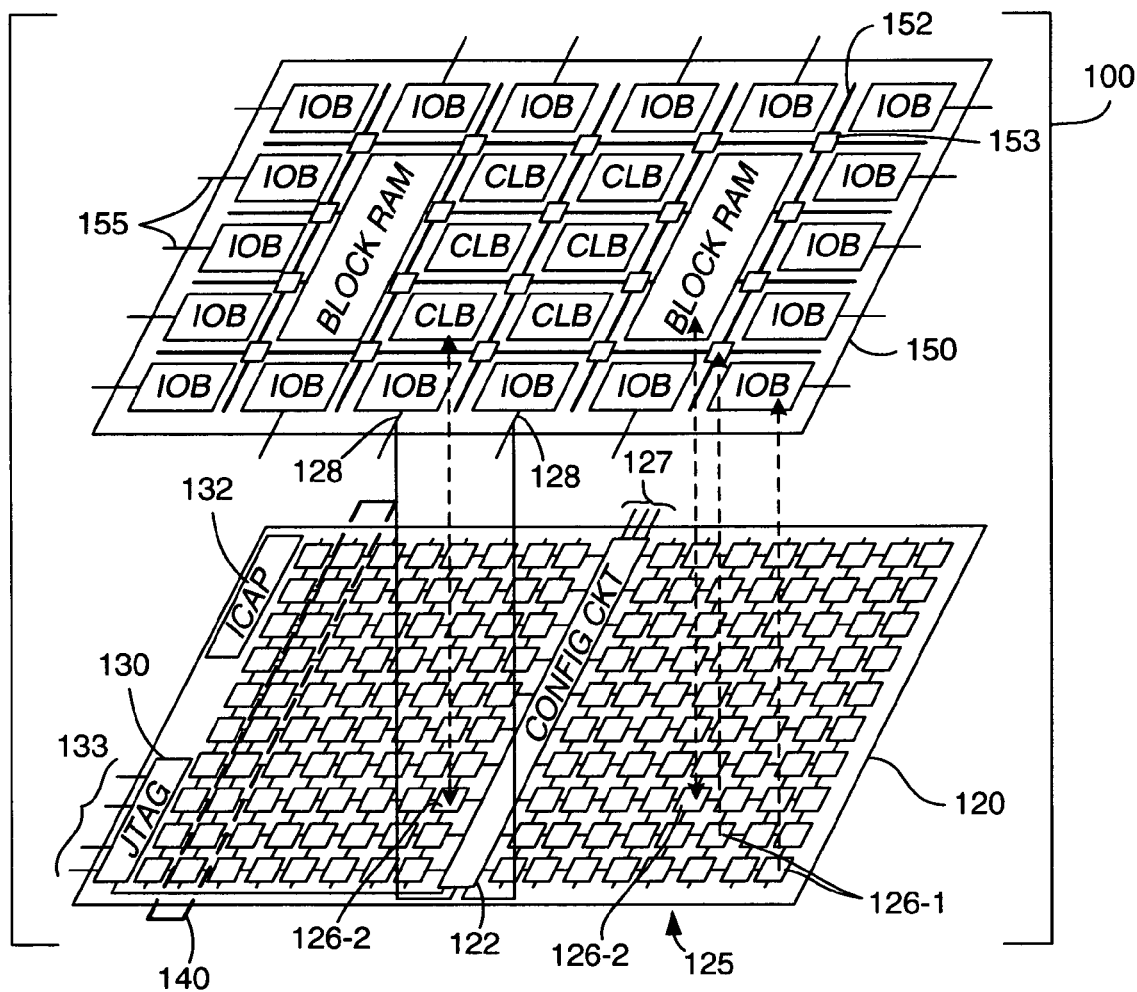
FIG. 1 is a split-level perspective view showing a simplified representation of a type of PLD, e.g., a Field Programmable Gate Array (FPGA)
Figure 2:
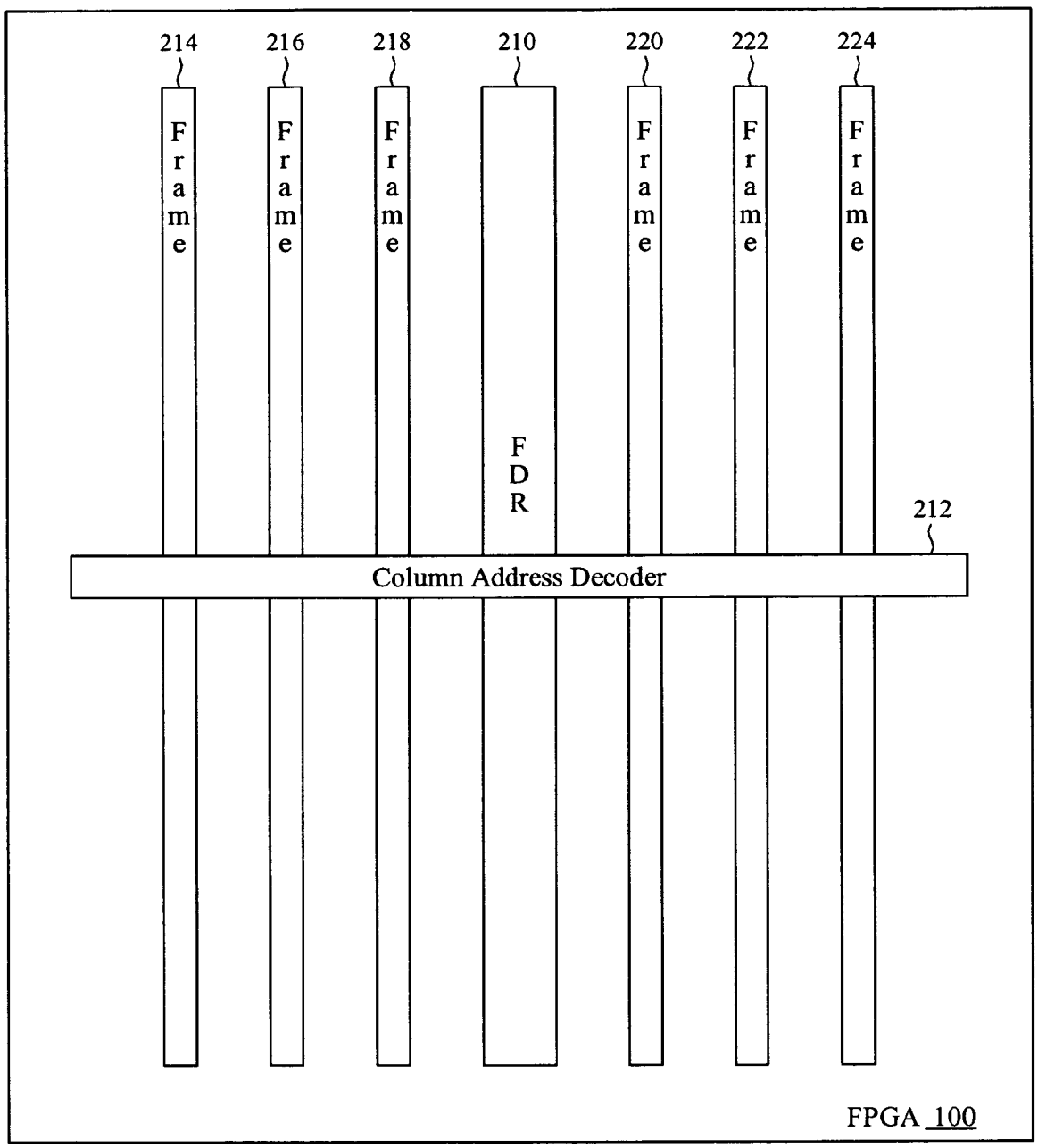
FIG. 2 illustrates a simplified frame arrangement for some configuration memory cells of the configuration plane of an FPGA.

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

An exemplary embodiment of the present invention has a system for programming memory cells of a memory array in an integrated circuit (IC). The IC includes at least some programmable logic elements and programmable interconnections that can be programmed by the memory array. One example of the IC is a PLD such as an FPGA. Another example is an IC having other application specific circuits, such as a digital signal processor, a microprocessor, controller circuit, or other non-configurable circuitry. The memory array includes a plurality of elements, where each element includes a plurality of memory cells (volatile or non-volatile or a combination thereof), where each element has a row address and a column address in the memory array.

The system may further include a column address decoder circuit providing the column address, where the column address decoder circuit may be distributed by being located in each hclk row of a H clock tree in a PLD. A description of the H-clock tree is given in co-pending U.S. patent application Ser. No. 10/836,722 entitled "A Differential Clock Tree in an Integrated Circuit" by Vasisht M. Vadi, et al., filed Apr. 30, 2004, which is herein incorporated by reference. In addition between each group of one or more columns are repeater or dataline driver circuits, which restores configuration data as it propagates in a row from the center to the edge of the chip.

The system further includes multiple fixed length data registers, such as frame data registers (FDRs), where a FDR is located in a row of the memory array for temporarily storing a fixed number of configuration bits for programming or configuring the element of the memory array in the row. In order to allow for pipelining of reads or writes of configuration data, each FDR is connected to a shadow register. For writing, configuration data is serially transferred from the configuration center to a FDR in a row, then in parallel transferred from the FDR to the shadow register, and then transferred in parallel to configuration memory cells in the element. For reading, configuration data is transferred in parallel from the configuration memory cells of an element in a column in a row, to the shadow register, then in parallel transferred from the shadow register to the FDR, and finally, serially transferred from the FDR to the configuration center.

The above embodiment of the system may further have the row selected by one or two row selection control signals. A one-hot FDR address control signal (fdr_addr) selects the FDR in the ith row, where i is an integer. A one-hot row address control signal (row_addr) selects the configuration memory cells in the row by gating the control signals to the control circuit in the ith row, hence either allowing or preventing reads or writes to the element(s) in the ith row. The fdr_addr and row_addr signals are linked and generated by one or more state machines in by the configuration logic in the configuration center. In housecleaning operations all of the fdr_addr and row_addr control lines may be asserted (deviating from the one-hot addressing) in order to clear all the configuration memory cells in the configuration memory array. In another embodiment of the invention fdr_addr and row_addr are the same signal. In yet another embodiment fdr_addr and/or row_addr need not be one-hot addresses but may be any other conventional addresses.

The partitioning of the configuration memory array into two-dimensions, e.g., (x,y) or rows and columns, rather than the traditional one-dimensional columns allows for both scalability of design and improvements in reconfigurability. Each row in one embodiment is the same or similar as every other row in structure. Each row has its own FDR and distributed column address decoder. One or more columns of configuration memory cells in a row may be written to or read from using frames of fixed length, i.e., fixed frames, regardless of the size of the PLD. Hence as the PLD increases in size, more rows are added, permitting a scalable design. The row, column partitioning also allows better control of reconfiguration of the PLD. For example, in partial reconfiguration of the configuration memory the appropriate row(s) and column(s) can be reconfigured rather than only the columns. In an alternative embodiment each configuration memory cell has a row and column address, so that only the configuration memory cells that need to be modified for reconfiguration are modified. In yet another embodiment, the configuration memory array is three-dimensional and there is an (x,y,z) or (row, column, plane) address (e.g., FIG. 3A shows one of a plurality of stacked planes).

Note that rows and columns are only used to an abstract organization of a memory, and that actual physical implementations may take on other arrangements. For instance, a row may be implemented as a column by simple rotation.

Figure 3A:
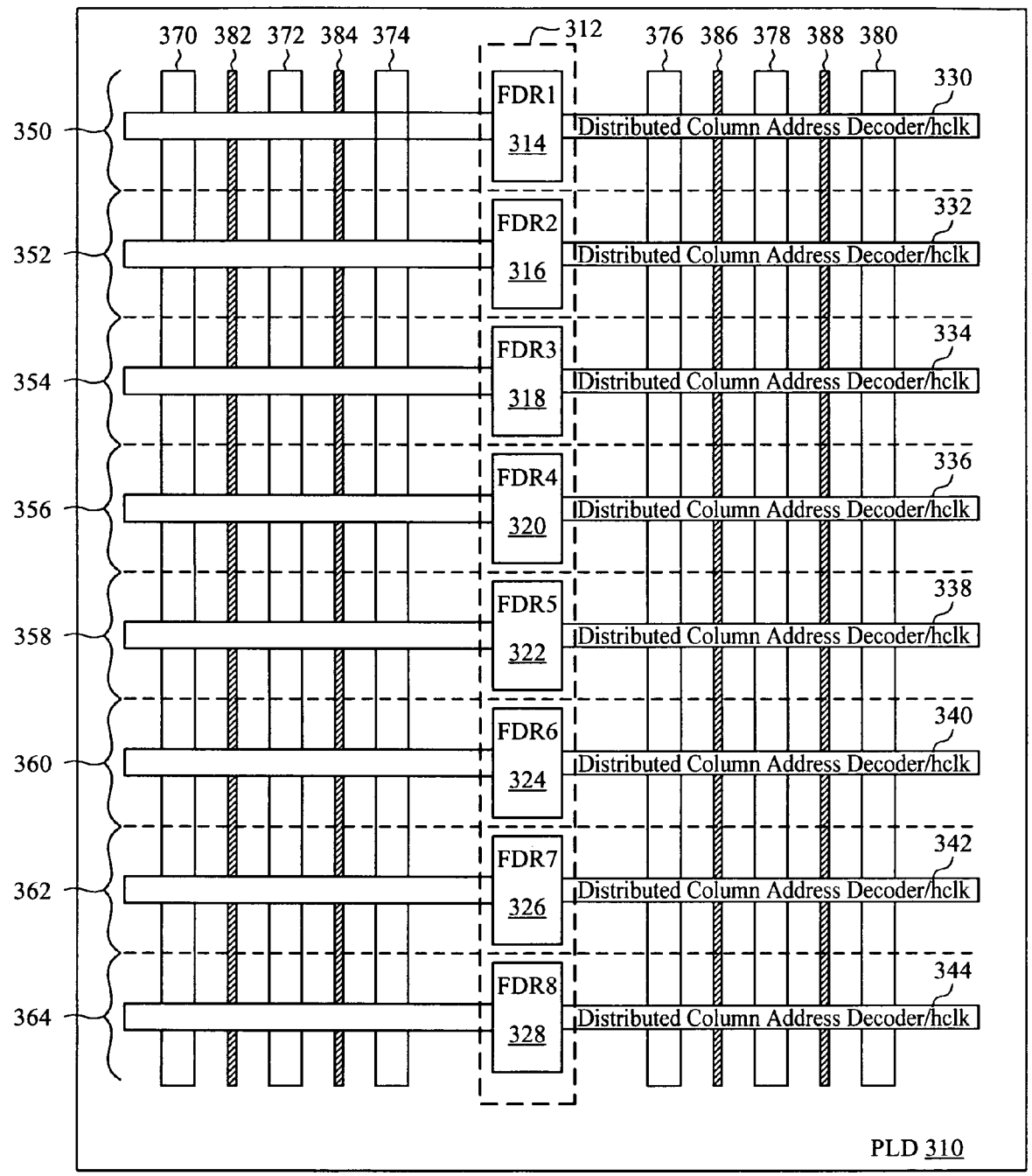
FIG. 3A is a simplified diagram part of a configuration structure for a PLD of an embodiment of the present invention.

FIG. 3A is a simplified diagram of part of a configuration structure for a PLD 310 of an embodiment of the present invention. The configuration structure includes part of a two-dimensional configuration memory array of configurable memory cells. The memory array arranged in a series of columns 370, 372, 374, 376, 378, and 380 and a series of rows 350, 352, 354, 356, 358, 360, 362, and 364. Each column includes one or more sub-columns of memory cells, where a sub-column stores a fixed frame of configuration data and has a minor address. The column has a major address. Hence the column address for a fixed frame may include a column type, major address and minor address like in conventional FPGAs (a further description of major and minor column addressing is found in Xilinx Application Note, entitled "Virtex Series Configuration Architecture User Guide" from Xilinx, Inc. Of San Jose, Calif., XAPP151, Mar. 24, 2003). Interposed between the columns 370-380 are dataline driver or repeater circuits 382, 384, 386, and 388.

Each of the rows 350-364 includes a FDR (FDR1-FDR8) 314, 316, 318, 320, 322, 324, 326, and 328 (collectively labeled FDR 312) and a distributed column address decoder 330, 332, 334, 336, 338, 340, 342, and 344 in the hclk row of the H clock tree, respectively. For example, to configure column 370 in row 352, bit stream data is first sent to FDR2 316 (serially or in parallel or a combination thereof) from the configuration center (not shown). Next, in parallel the data in FDR2 316 is transferred to the configuration memory cells in column 370 in row 352. The dataline drivers in columns 382 and 384 will restore the digital bit stream data as it moves across row 352 from the FDR to column 370. For reading back the configuration memory cell data in column 370 of row 352, the data is sent back in parallel to FDR2 316 from column 370 of row 352 and then read (serially or in parallel or a combination thereof) from FDR2 to the configuration center (not shown).

Figure 3B:
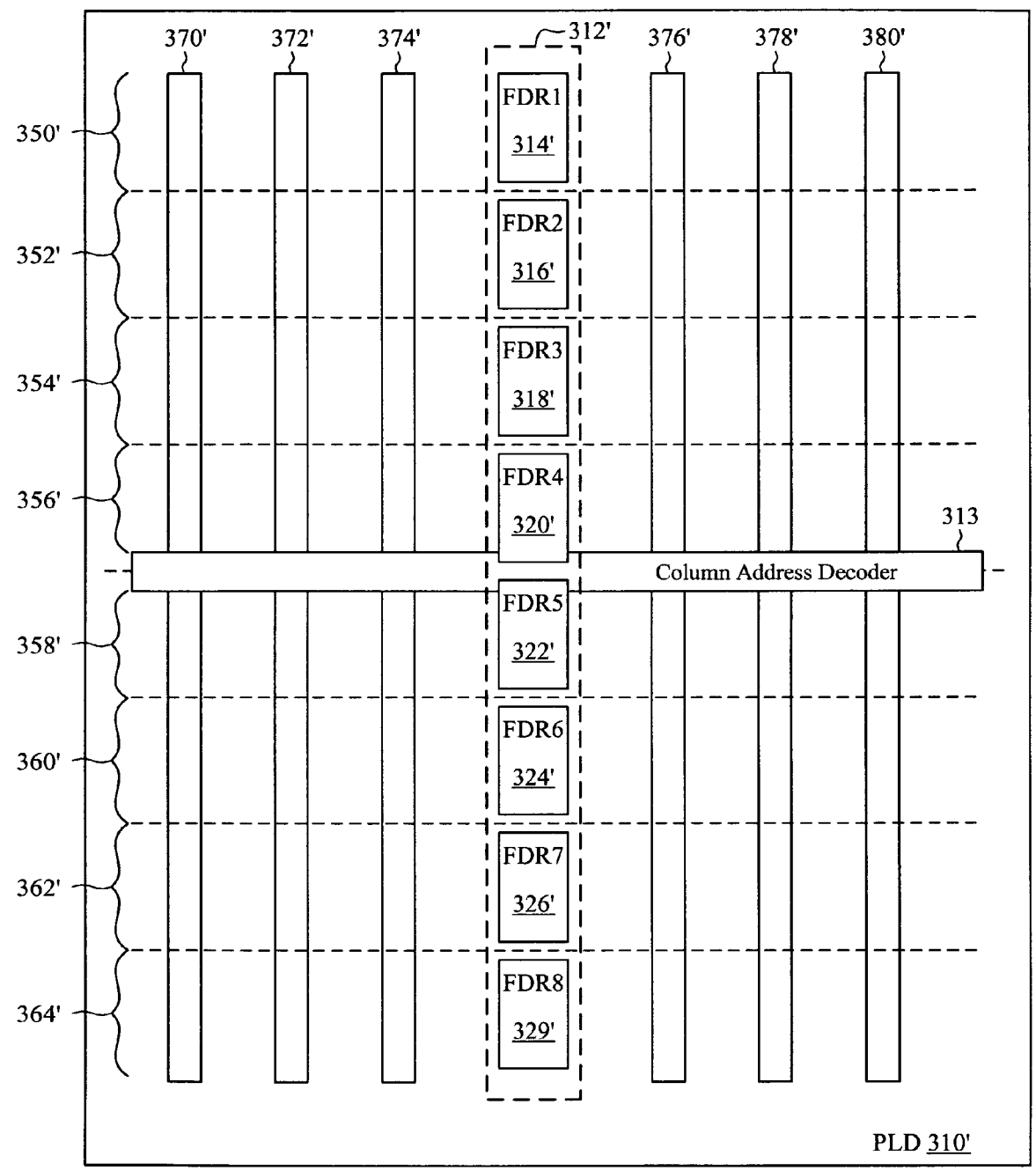
FIG. 3B is a simplified diagram of part of a configuration structure for a PLD of an alternative embodiment of the present invention.

FIG. 3B is a simplified diagram of the configuration structure for a PLD 310' of an alternative embodiment of the present invention. The memory array is arranged in a series of columns 370', 372', 374', 376', 378', and 380' and a series of rows 350', 352', 354', 356', 358', 360', 362', and 364'. FIG. 3B is different from FIG. 3A in that the column address decoder circuit 313 is not distributed by rows, but is centrally located between rows 356' and 358'. In addition the dataline driver circuits 382, 384, 386, and 388 are absent.

Figure 4:
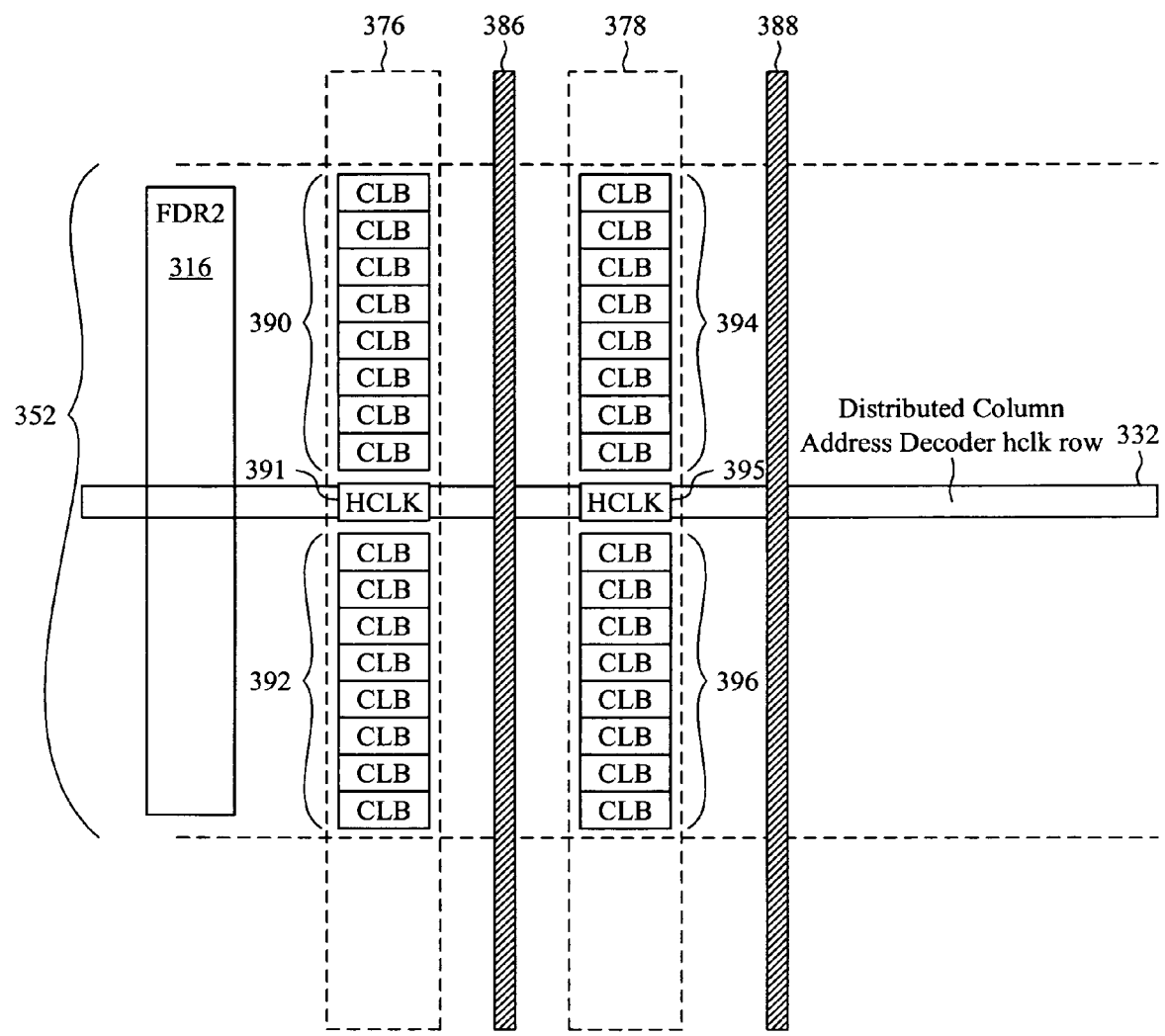
FIG. 4 is a more detailed diagram of part of a row of FIG. 3A.

FIG. 4 is a more detailed diagram of part of a row 352 of FIG. 3A of an embodiment of the present invention. Part of columns 376 and 378 of row 352 are shown in more detail. Column 376 of row 352 may include a first block of configuration memory cells for 8 Configuration Logic Blocks 390 (CLBs), a HCLK block 391, and 8 more CLB's 392. Similarly, column 378 of row 352 may include a second block of configuration memory cells for 8 Configuration Logic Blocks 394 (CLBs), a HCLK block 395, and 8 more CLB's 396. The CLB's are well-known and are described in the Virtex-II Pro Platform FPGA Handbook by Xilinx, Inc. of San Jose Calif., October 2002. The HCLK blocks 391 and 395 and hclk row 332 are described in co-pending U.S. patent application Ser. No. 10/836,722 entitled "A Differential Clock Tree in an Integrated Circuit" by Vasisht M. Vadi, et. Al, filed Apr. 30, 2004. In one example, the 16 CLBs are programmed by 40 words of configuration data. At 32 bits per word, there are 1280 configuration memory cells. In this example, the HCLK blocks 391 and 395 have 16 memory cells apiece. FDR2 has 41 words (at 32-bits per word) or 1312 bits for a fixed frame, which includes 32 bits for the HCLK block even though only 16 bits are used.

Figure 5:
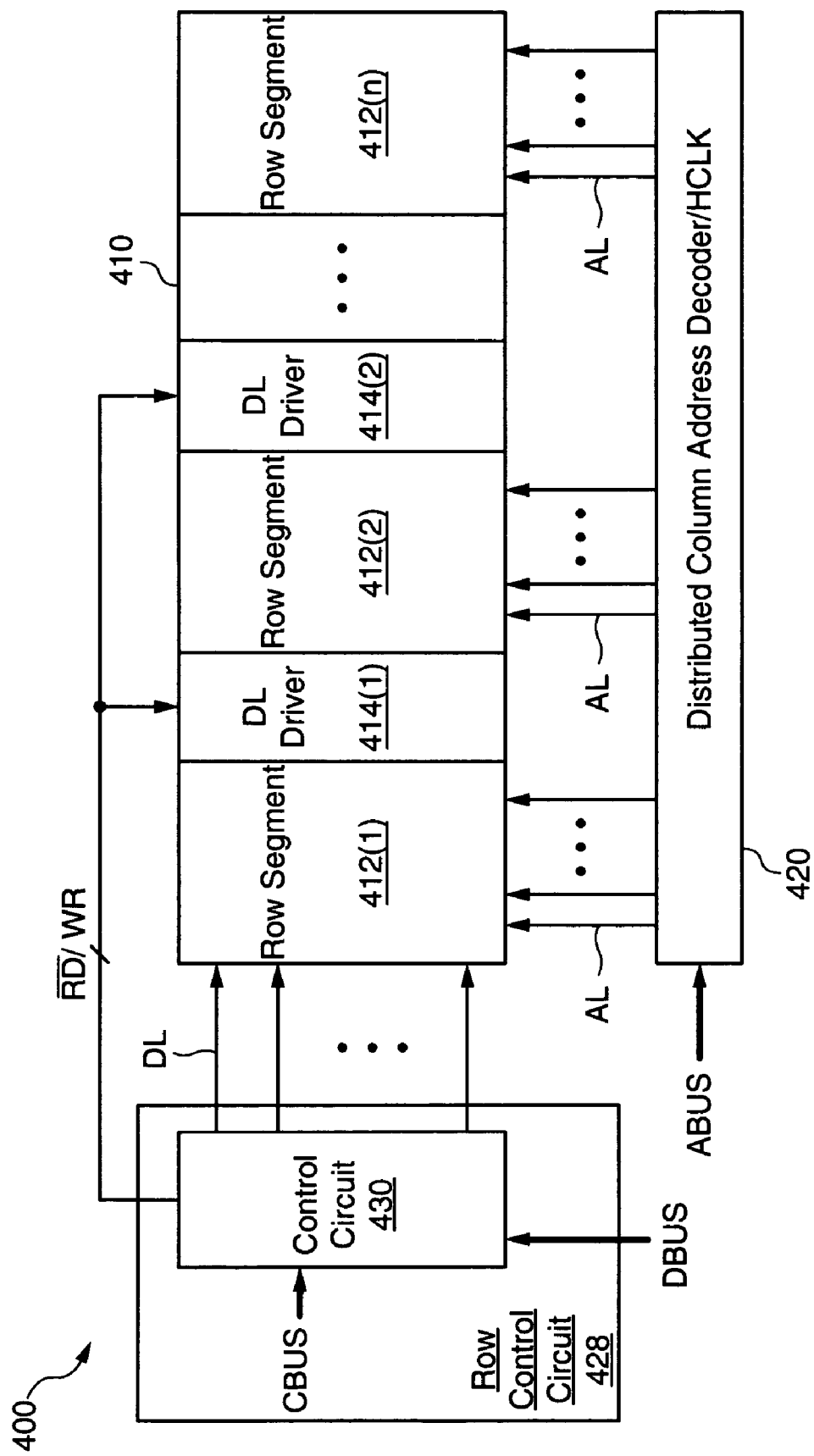
FIG. 5 shows a block diagram of a part of a row in accordance with one embodiment of the present invention.

FIG. 5 shows a block diagram 400 of a part of a row in accordance with one embodiment of the present invention. Block diagram 400 shows a memory array 410, a distributed column address decoder/hclk circuit 420, and row circuit 428 having a read/write control circuit 430. For some embodiments, the memory cells are SRAM cells, although other memory cells, both volatile and/or non-volatile (one time or many time programmable) can be used.

With reference to FIGS. 3A, 4 and 5, block diagram 400 shows the top half of row 352, where the distributed column address decoder/hclk circuit 420 corresponds to 332, the row segment 412(1) and 412(2) correspond to the 8 CLBs 390 and 394, respectively, and the DL drivers 414(1) and 414(2) correspond to parts of dataline driver columns 386 and 388, respectively. Memory array 410 has sub-rows of row 352, where each sub-row is connected to control circuit 430 via a corresponding dataline pair DL, and each column in array 410 is connected to address decoder 420 via corresponding address lines AL. Address decoder 420 is well-known, and includes circuitry to select one of address lines AL in response to an address provided on an address bus ABUS. Read/write control circuit 430 controls read, write, and test operations for array 410, and is coupled to a data bus DBUS and to a control bus CBUS. DBUS provides from FDR2 (or FDR2's corresponding shadow register) write configuration data to and routes read configuration data from array 410 to FDR2 (or FDR2's corresponding shadow register) via row circuit 428 which includes control circuit 430. CBUS provides various control signals to control circuit 430.

CBUS includes control signals such as a power-on reset signal POR, a pre-charge signal PCH, a pre-discharge signal PDCH, a test signal TEST, and a write control signal WR. Further details on these CBUS signals are described in co-pending, commonly assigned U.S. patent application Ser. No. 10/796,750 filed Mar. 8, 2004 entitled "Segmented Dataline Scheme in a Memory with Enhanced Full Fault Coverage Memory Cell Testability," by Vasisht M. Vadi, et al., which is herein incorporated by reference.

Row circuit 428 gates (via AND gates) PCH, PDCH, TEST, and WR with a bit of the row address (row_addr) signal (not shown) before these signals go to control circuit 430. The row address signal is produced by the configuration logic in the configuration center and is the address of the row the fixed frame(s) are written to. In one embodiment the row_addr signals are a one-hot signal similar to, but different from, the fdr_addr signal. Thus, when row_addr is asserted for a row, reads to and writes from one or more columns in the row are allowed, i.e., the control signals PCH, PDCH, TEST, and WR are allowed to pass through the one or more AND gates.

As illustrated in FIG. 5, the sub-rows of memory array 410 are divided into a plurality of row segments 412(1)-412(n), each of which can include any suitable number of memory cells. For some embodiments, the row segments include the same number of memory cells, while in other embodiments the row segments include different numbers of memory cells. Each row segment 412(1)-412(n) includes an associated dataline segment to which the memory cells therein are connected (for simplicity, the dataline segments are not shown in FIG. 5). Dataline drivers 414 are provided to selectively buffer signals between dataline segments in adjacent row segments 412 in response to read and write control signals. During write operations, dataline drivers 414 propagate write data in a first direction from control circuit 430 along adjacent dataline segments to selected memory cells, while during read operations dataline drivers 414 propagate read data in a second direction from selected memory cells along adjacent dataline segments to control circuit 430. In particular, using dataline drivers 414 rather than duplicating control circuit 430 to drive the segments requires less area. Further details are described in co-pending, commonly assigned U.S. patent application Ser. No. 10/796,750 filed Mar. 8, 2004 entitled "Segmented Dataline Scheme in a Memory with Enhanced Full Fault Coverage Memory Cell Testability," by Vasisht M. Vadi, et al., which is herein incorporated by reference.

Figure 6:
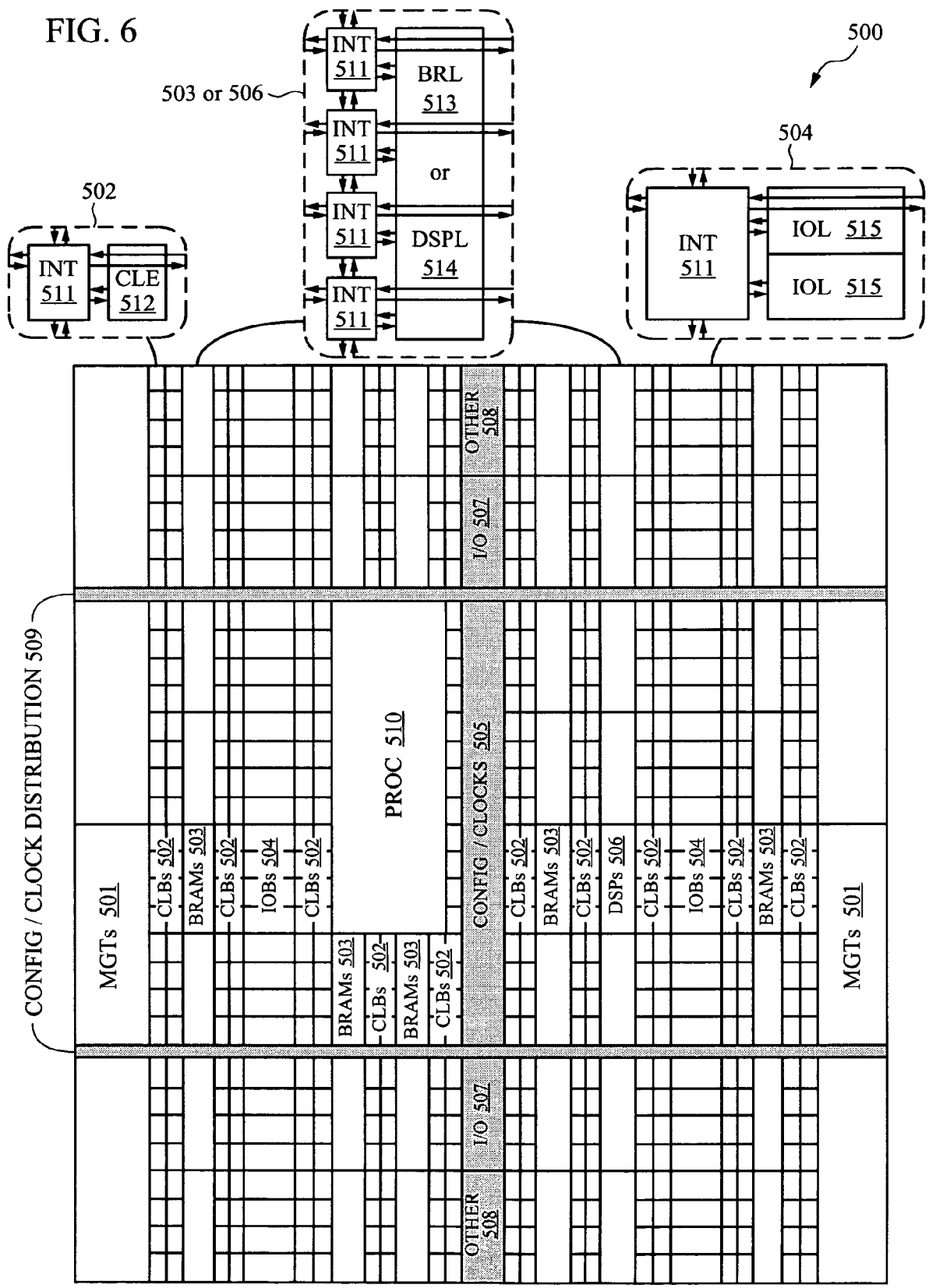
FIG. 6 shows a PLD that has the configuration memory array of FIG. 3A.

FIG. 6 shows a PLD that includes the configuration memory array of FIG. 3A of an embodiment of the present invention. FIG. 6 illustrates an FPGA architecture 500 that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 6.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 6) is used for configuration, clock, and other control logic. Horizontal areas 509 extending from this column are used to distribute the clocks and configuration signals across the breadth of the FPGA. The CONFIG/CLOCKS 505 includes the configuration center having the configuration logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 510 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

Figure 7:
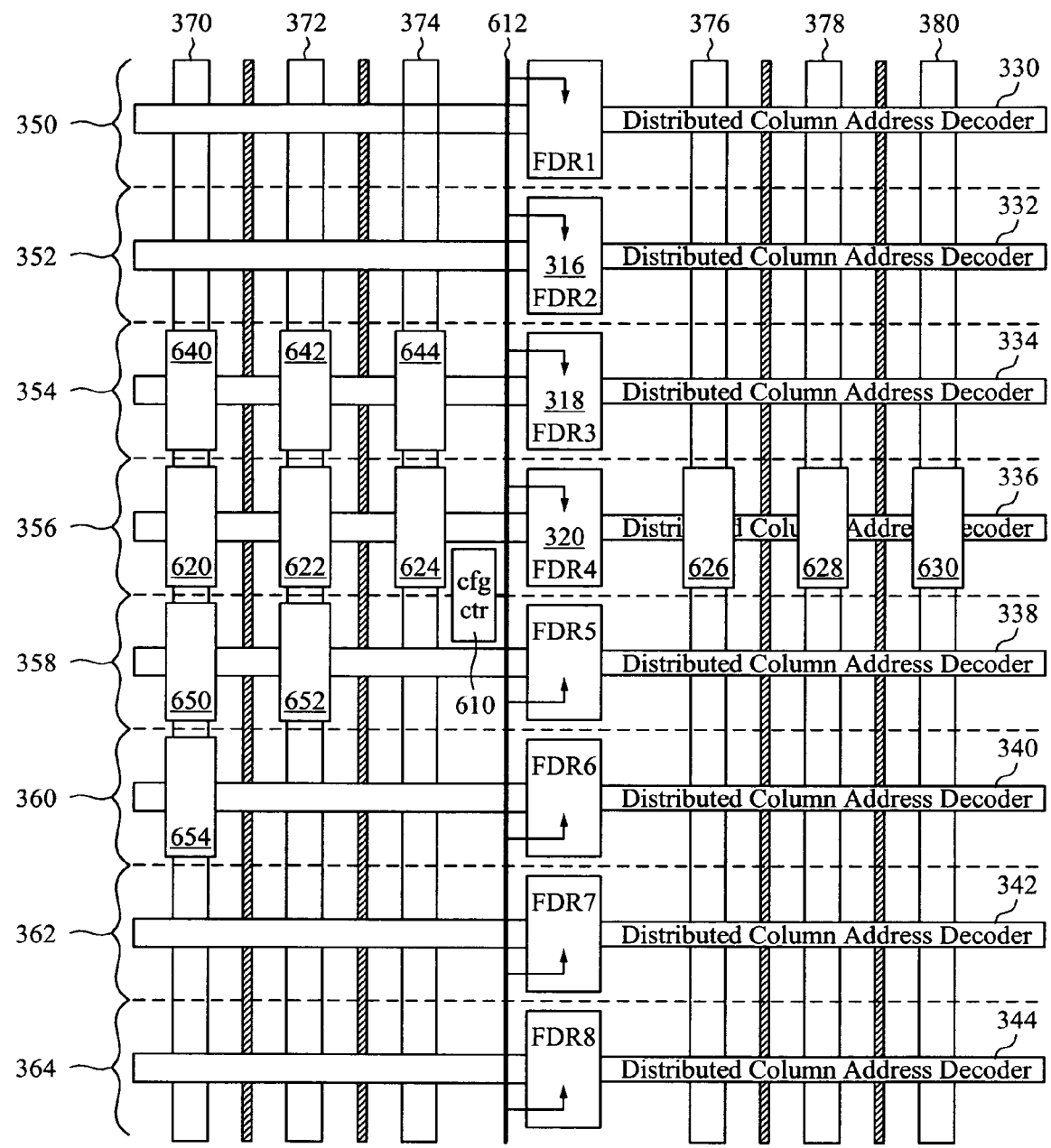
FIG. 7 shows a configuration write procedure of an embodiment of the present invention.

FIG. 7 shows a configuration write procedure of an embodiment of the present invention. FIG. 7 has a structure like FIG. 3A. In configuring PLD 310, the procedure starts at row 356 and writes to frames in columns 370 to 380, starting with column 370. Thus for example the following fixed frames in row 356 are written in sequence: 620, 622, 624, 626, 628, and 630. Next the columns in row 354 are written from left to right, e.g., 640, then 642, then 644, and so forth. The rows are written in the following sequential order 356, 354, 352, 350, 358, 360, 363, and 364 (i.e., top half then the bottom half). In one example, the a frame having 41 words is serially written by word (32 bits in parallel) from the configuration center (cfg_ctr) 610 via bus 612 to FDR4 and in parallel from FDR4 to column 370 in row 356 to configure the configuration memory cells in 620. Hence frames are written from cfg_ctr 610 to each FDR via bus 612 to configure all the columns in each row and all the rows in PLD 310.

Figure 8A:
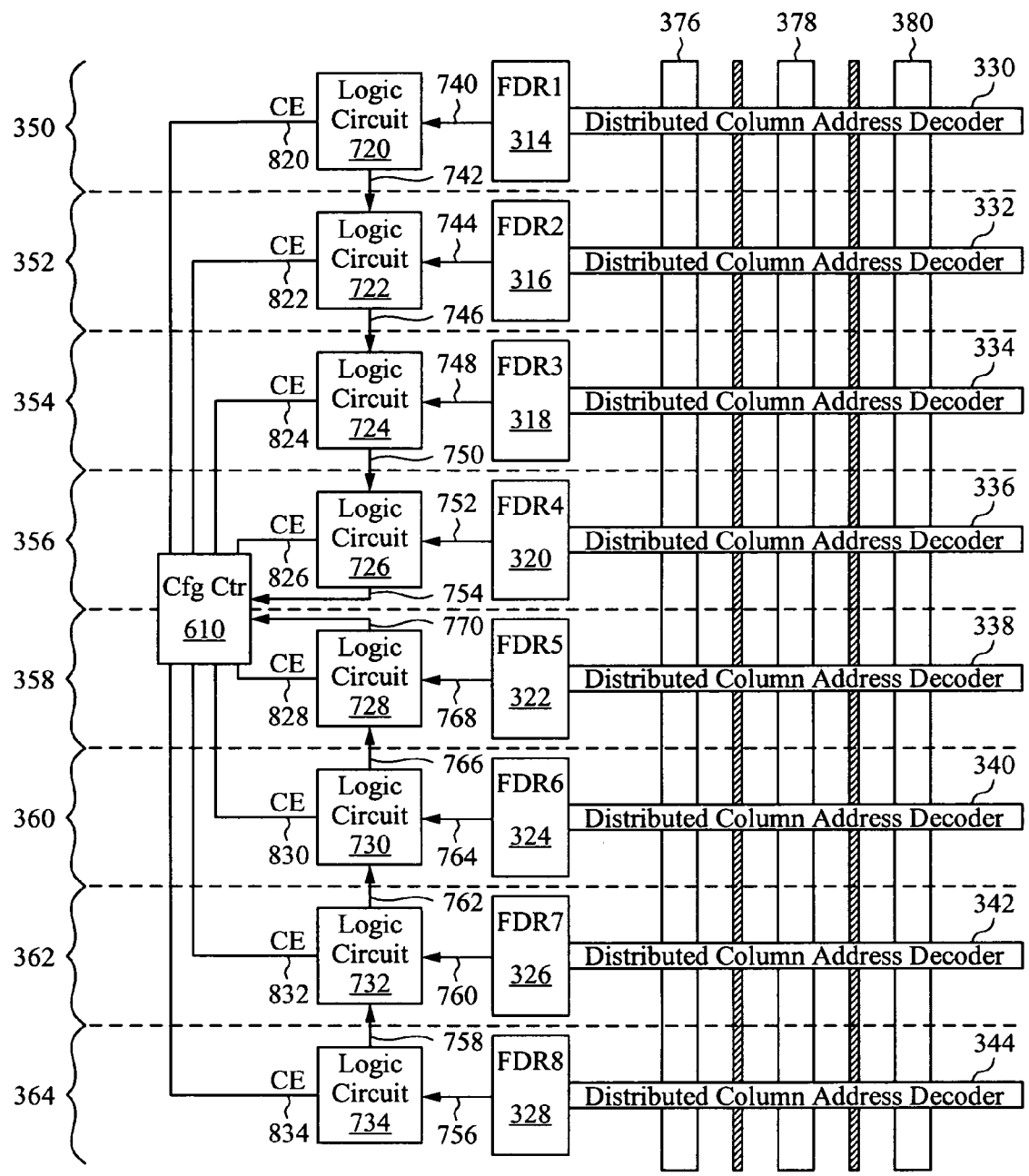
FIGS. 8A/B show a configuration read or readback structure of an embodiment of the present invention.

FIGS. 8A/B show a configuration read or readback structure of an embodiment of the present invention. FIG. 8A has a structure like FIG. 3A. FIG. 8A shows additional read circuitry (logic circuits 720 to 734), which enable readback from one selected FDR to the configuration center 610. Each logic circuit 720 to 734 is connected to an associated FDR, i.e., FDR1 to FDR8, respectively. Each of the logic circuits 720, 722, 724, and 726 are connected in series, where logic circuit 726 is connected to the configuration center 610. Similarly, each of the logic circuits 734, 732, 730, and 728 are connected in series, where logic circuit 728 is connected to the configuration center 610. Each logic circuit has its own clock enable (CE) control signal, e.g., CE 820 for logic circuit 720, CE 822 for logic circuit 722, CE 824 for logic circuit 724 and CE 826 for logic circuit 726. Similarly, logic circuits 728-734 have CE signals 828-834, respectively.

Figure 8B:
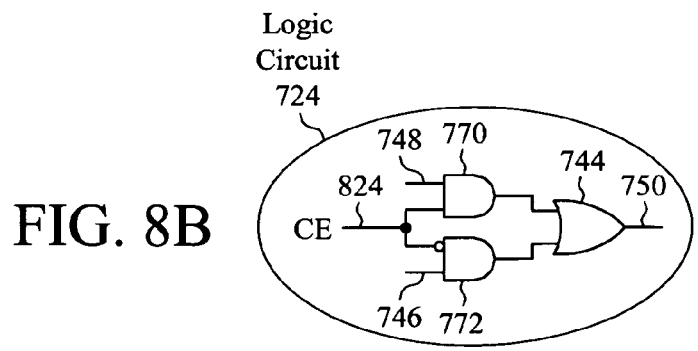

An expanded view of logic circuit 724 is shown in FIG. 8B (all the logic circuits 720 to 734 have similar logic to 724). Logic circuit 724 includes AND gates 770 and 772 coupled to OR gate 774. Input 748 from FDR3 318 is AND'd with CE 824. Input 746 from upstream logic circuit 722 is AND'd with the inverse of CE 824. OR gate 774 receives the outputs of AND gates 770 and 772 and outputs 750 which goes to downstream logic circuit 726.

Figure 9A:
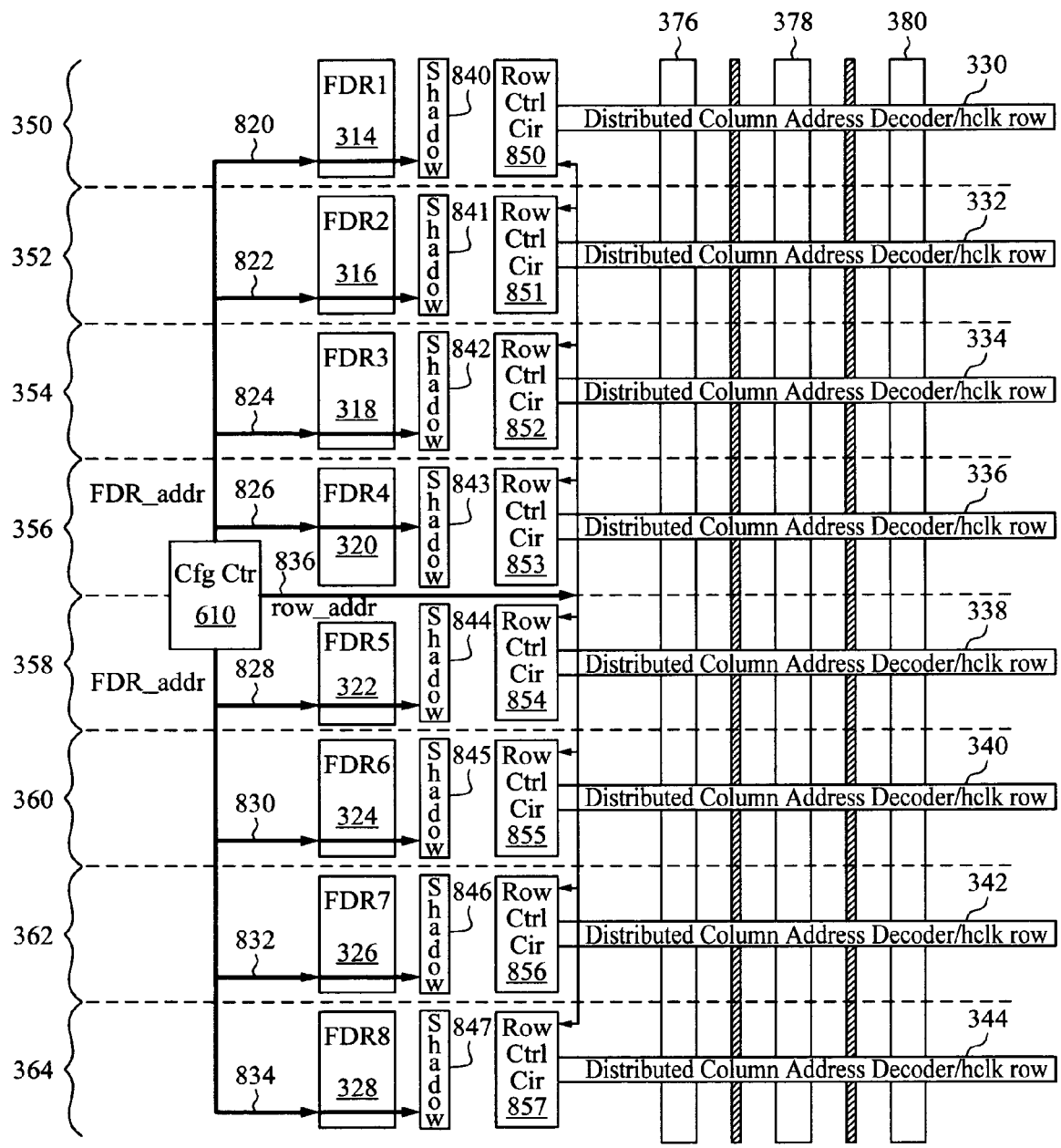
FIG. 9A is a diagram of the row selection signals of an embodiment of the present invention.

FIG. 9A is a diagram of the row selection signals of an embodiment of the present invention. FIG. 9A has a structure similar to parts of FIG. 3A, except for the addition of shadow registers 840 to 847, row control circuits (row ctrl cir) 850 to 857, cfg_ctr 610, fdr_addr control signals 820-834, and row_addr control bus signal 836. The fdr_addr signals are in one embodiment the same as clock enable signals (CE) 820-834 in FIG. 8 and have the same number labels.

For data flow purposes, each row in FIG. 9A has a FDR coupled to a shadow register, where the FDR is also coupled to the configuration center 610 and where the shadow register is coupled to the configuration memory cells in a the columns in the row. For example for row 352, FDR2 316 is connected to the configuration center 610 via a data bus (like bus 612 in FIG. 7). FDR2 is then connected to shadow register 841, which in turn is connected to columns 376, 386, 378, 388, and 380.

For control purposes each row has a fdr_addr control signal which selects the appropriate FDR and shadow register and a row_addr signal which selects the appropriate row control circuit. For example, for row 352, FDR2 and shadow register 841 are enabled by fdr_addr 822 (CE 822 in FIG. 8). fdr_addr 822 is a one-hot address signal generated by a state machine in cfg_ctr 610. Row control circuit 851 receives one-hot row address bus signal 836 from another state machine in cfg_ctr 610. One signal line of row_addr bus 836 enables the configuration memory cells in the columns (as determined by distributed column address decoder 332) in row 352 to be written to or read from.

Figure 9B:
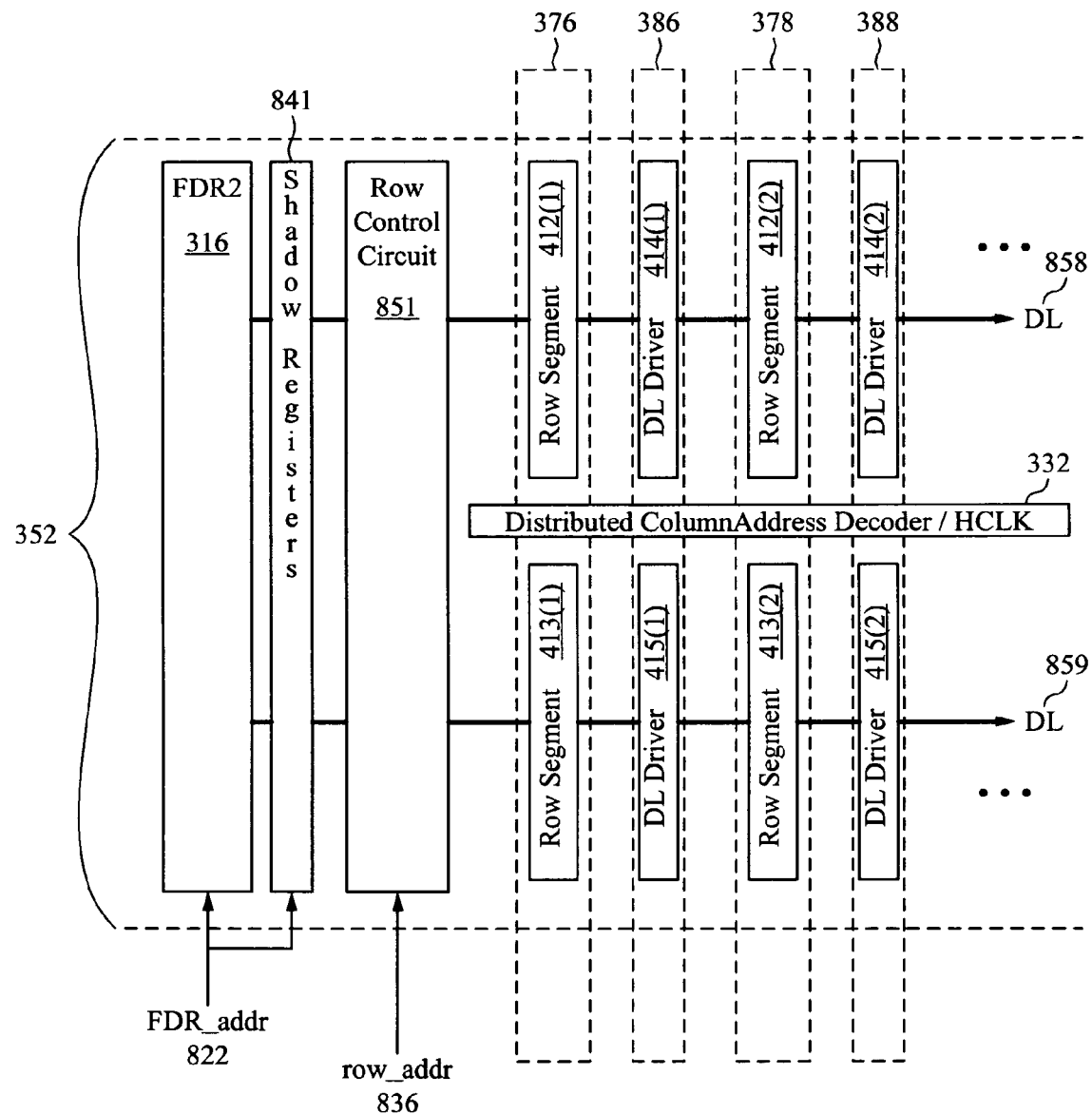
FIG. 9B is an expanded view of one row of FIG. 9A.

FIG. 9B is an expanded view of one row 352 of FIG. 9A of an embodiment of the present invention. With reference to FIG. 5, row control circuit 851 includes row circuit 428 and distributed column address decoder 332 maps to address decoder 420 in FIG. 5. The row segments 412 and DL drivers 414 in FIG. 9B correspond to those in FIG. 5. In column 376 are shown row segments 412(1) and 413(1). In column 378 are shown row segments 412(2) and 413(2). In column 386 are shown data line (DL) driver circuits 414(1) and 415(1). In column 388 are shown DL driver circuits 414(2) and 415(2). The data lines 858 and 859 show the transfer of a frame of data from the FDR2 316 via shadow register 841 to, for example, row segment 412(2) and row segment 413(2), when fdr_addr 822 and one signal line in row_addr 836 are asserted.

Figure 10:
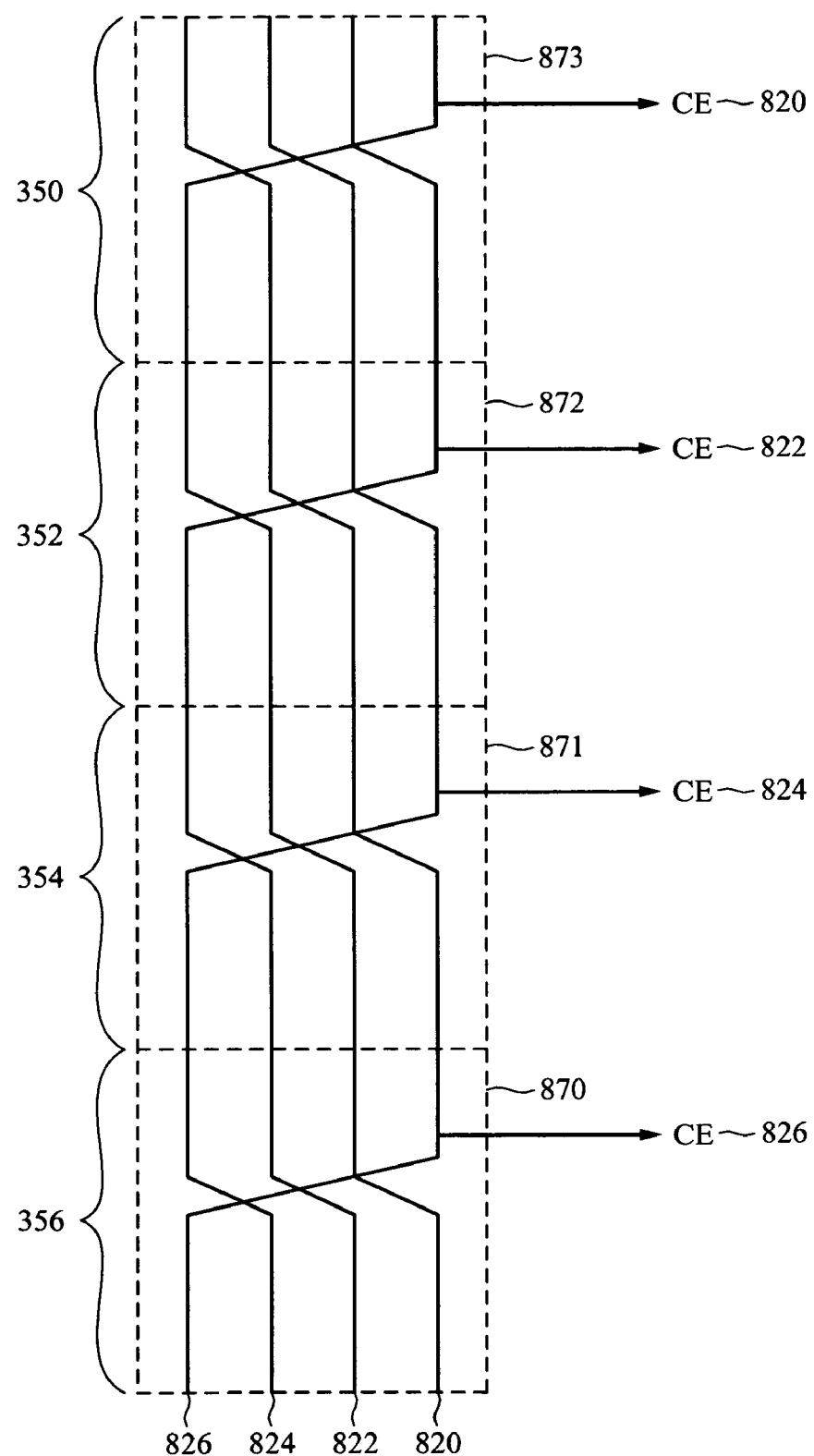
FIG. 10 shows a simplified example of repeatable layout of control signal lines for the fdr_addr (or CE) signals of an embodiment of the present invention.

FIG. 10 shows a simplified example of a repeatable layout of some of the control signal lines for the fdr_addr (or CE) signals of an embodiment of the present invention. The CE signals 820 to 826 correspond to the same signals in FIG. 9A. Each layout block 870, 872, 874, and 876 is substantially identical and rotates the CE signal by one position. For example, layout block 870 has the CE signals in the following order: 826, 824, 822, and 820. Layout block 872 has the CE signals in the following order 824, 822, 820, and 826. Layout block 874 has the CE signals in the following order 822, 820, 826, and 824, and so forth. For the one hot row_addr bus signal 836 a similar structure selects the row address signal for the selected row.

Figure 11:
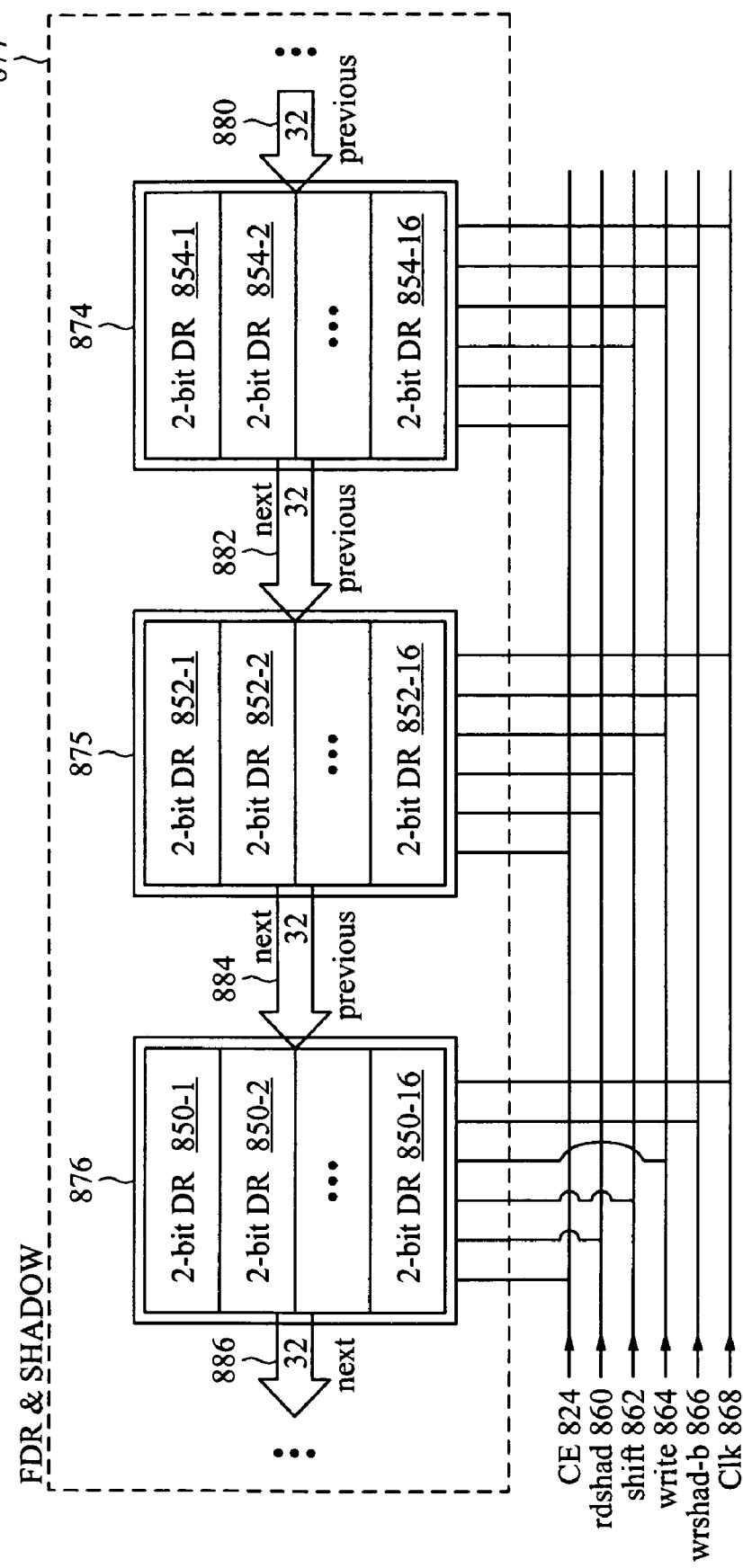
FIG. 11 is a block diagram of the structure of a FDR plus shadow register of an embodiment of the present invention.

FIG. 11 is a block diagram of the structure of a FDR plus shadow register of an embodiment of the present invention. Circuit 877 may include, for example, FDR3 318 and shadow register 842 of FIG. 9A. Circuit 877 has L 32-bit data registers, e.g., 874, 875, and 876, where each data register holds a word, and L=41 in one example. The L data registers are connected in series, e.g., 32 bits 880 (previous) are input into data register 874, which outputs 32 bits 882 (next) in parallel. Register 875 inputs the 32 bits 882 (previous) and outputs 32 bits 884 (next). Register 876 inputs the 32 bits 884 (previous) and outputs 32 bits 886 (next), and so on. 32 bits are shifted in parallel. For example, the 32 bits in data register 874 are shifted in parallel to the same bit positions in data register 875 and the 32 bits in data register 875 are shifted in parallel to the same bit positions in data register 876.

Each 32-bit data register, e.g., 874, 875, and 876, has 16 2-bit data registers, e.g., 850-1 to 850-16, 852-1 to 852-16, and 854-1 to 854-16. Each 2-bit data register, e.g., 850-1 to 850-16, includes 6 control signals: clock enable (CE) 824, read shadow register (rdshad) 860, shift 862 (shift words in FDR), write 864 (when 0, read from configuration memory, e.g., dl_in, to the shadow register), write shadow register inverted (wrshad_b) 866, and a clock (clk) 868.

Figure 12:
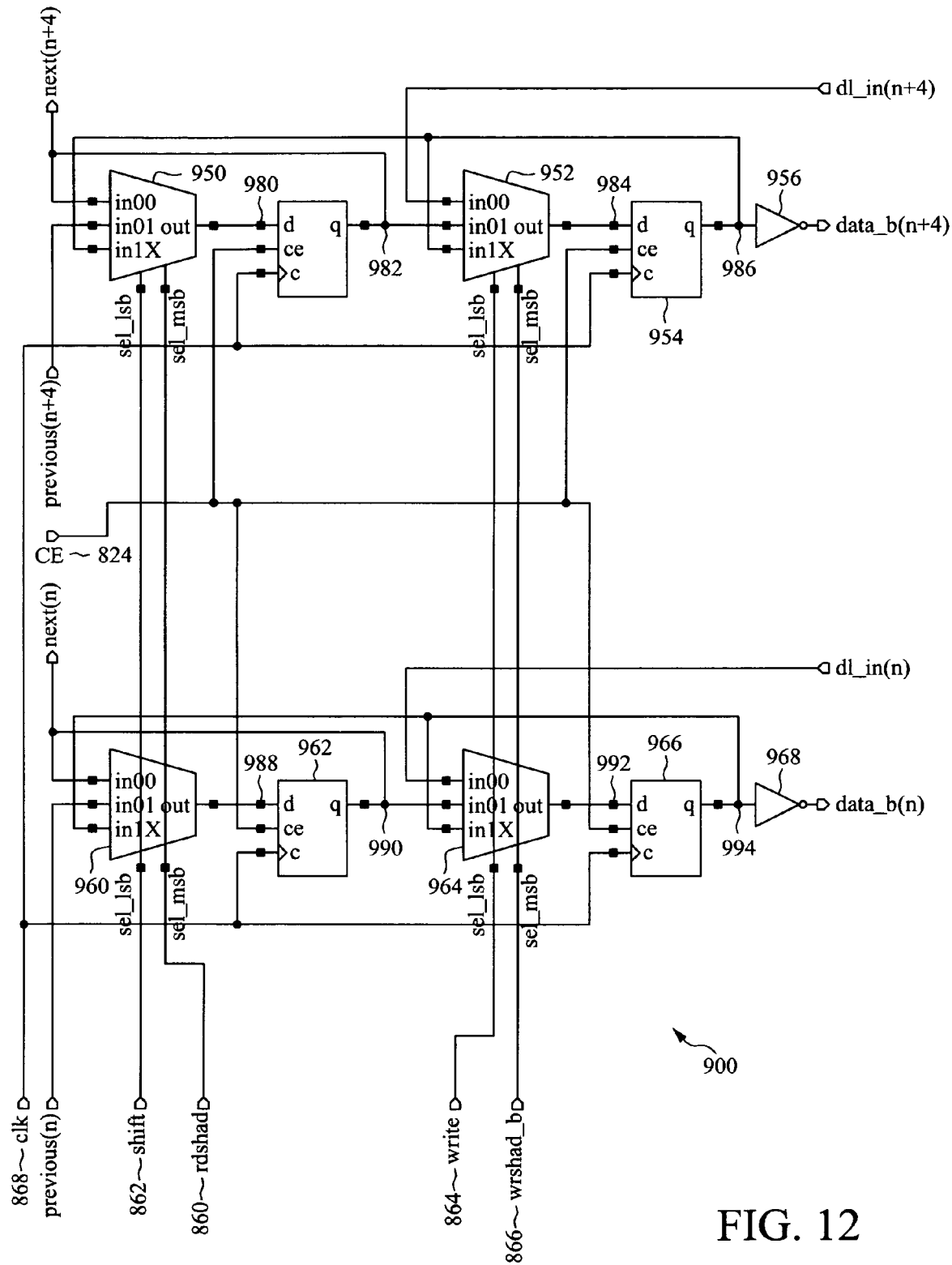
FIG. 12 is a circuit schematic for a 2-bit DR, such as for 2-bit DR in FIG. 11.

FIG. 12 is a circuit schematic for a 2-bit DR, such as for 2-bit DR 852-1 in FIG. 11, of an embodiment of the present invention. There are two duplicate circuits in FIG. 12, one for the nth circuit and one for the (n+4) circuit, where n=0 to 3 and 8 to 11. The n circuit has two multiplexers 960 and 964, two D flip flops 962 and 966, and one inverter 968. Mux 960 selects between the previous(n) data value (configuration data bit from a previous data register in a previous 32-bit data register (FIG. 11), the output 990 of D flip-flop 962, and the output 994 of D flip flop 966, depending on control signals shift 862 and rdshad 860. The output 990 goes to next(n). Mux 964 selects between a configuration bit dl_in(n) from a configuration memory cell, the output 990 of D flip-flop 962, and the output 994 of D flip flop 966, depending on control signals write 864 and wdshad_b 866. The output 994 of D flip flop 966 goes to data_b(n) via inverter 968. The n+4 circuit is similar. The operation of circuit 900 is well-known.

Figure 13:
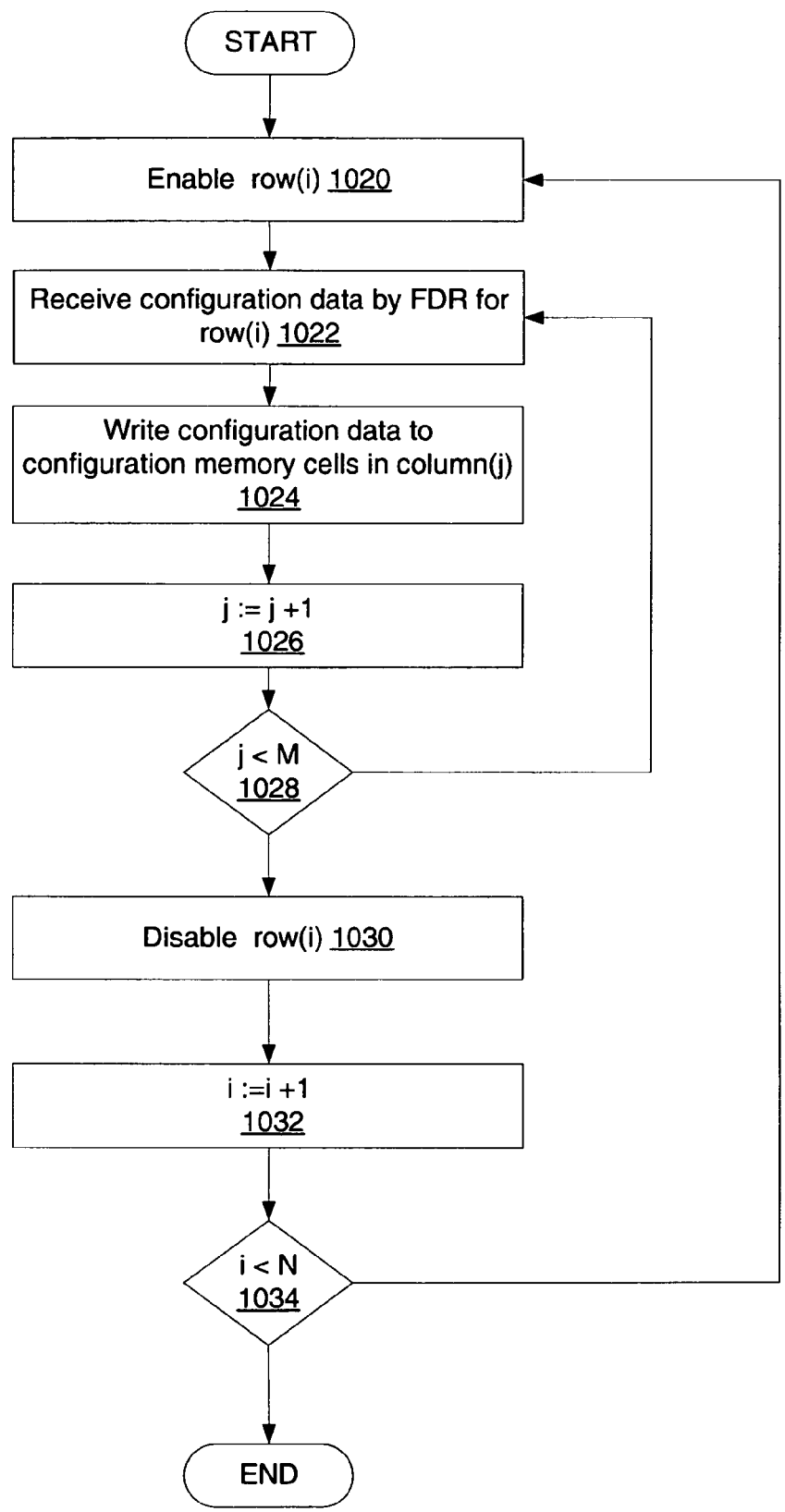
FIG. 13 is a simplified flowchart of row by row programming of configuration memory of an embodiment of the present invention.

FIG. 13 is a simplified flowchart of row by row programming of configuration memory of an embodiment of the present invention. For illustration purposes, it is first assumed that there are no shadow data registers, and that the fdr_addr signal and row_addr signal are the same. As an example, let FDR have 41 words of 32 bits for each word. The 41 words are stored in 41 registers. The 41 registers are connected together such that the bits in the first register are shifted in parallel to same bit positions in the second register, the bits in the second register are shifted in parallel to same bit positions in the third register, and so forth. Hence 32 bits are shifted in parallel from one register to a downstream register 41 times.

Steps 1020 to 1028 show the sequential writing of FDR data for each column in a row. At step 1020 row(i) is enabled with the other rows disabled. At step 1022 configuration data, e.g., 1312 bits (41×32), are received by FDR in 41 cycles. Next, in parallel the 41 words (at 32-bits per word) are written to the configuration memory cells in column(j) from the FDR (step 1024). This write operation takes some time less than 41 cycles. The column index is incremented (step 1026), and if there are still columns in a row to be written to (j<M, where j and M are integers, decision 1028), step 1022 is repeated. Hence, for our example, it takes at most about [(41+41)×M] cycles to configure the memory cells for the M columns in the row.

In one embodiment, when all the M columns in a row have been written to, then that row is disabled (step 1030), the row incremented (step 1032), and as long as there are rows to be written to (i<N, where I and N are integers, decision 1034), then step 1020 is repeated. While in this embodiment, all rows and all columns are written to, in another embodiment, all columns in one or more rows are written to. In yet another embodiment, all rows in one or more columns are written to. And further in another embodiment, only a selected row and a selected column are written to. The ability to select a row, a column or a combination thereof, makes reconfiguration of a PLD more flexible and easier.

Reading is similar to writing, except steps 1022 and 1024 are different. Step 1022 is replaced by receiving configuration data by FDR for row(i) from configuration memory cells in columns). In our example, 41 words are read in parallel into FDR; this should take at most 41 cycles. Step 1024 is replaced by writing the FDR data to the configuration center. As the data is serially read out, a word at a time (i.e., in parallel), this takes 41 cycles. Hence, for our example, it takes at most about [(41+41)×M] cycles to read the memory cells from the M columns in the row.

Because it normally takes a substantial time to read/write from/to the configuration memory cells in a column, shadow registers have been included in one embodiment to pipeline the read and write processes. Thus, in our example, configuration memory data, e.g., the 41 words, can be first read in parallel from the configuration memory cells in columns) in row(i) to the shadow register having 41 data registers of 32 bits each. This takes less than 41 cycles. In about one cycle, the 41 words are transferred in parallel to the FDR. Next the 41 words are transferred serially to the configuration center from the FDR (taking 41 cycles). Concurrently, with this transfer from FDR to the configuration center, 41 words from the next column(j+1) of row(i) are read into the shadow register. Hence, the FDR and shadow register form a pipeline process for reading the configuration memory cell data.

Figure 14:
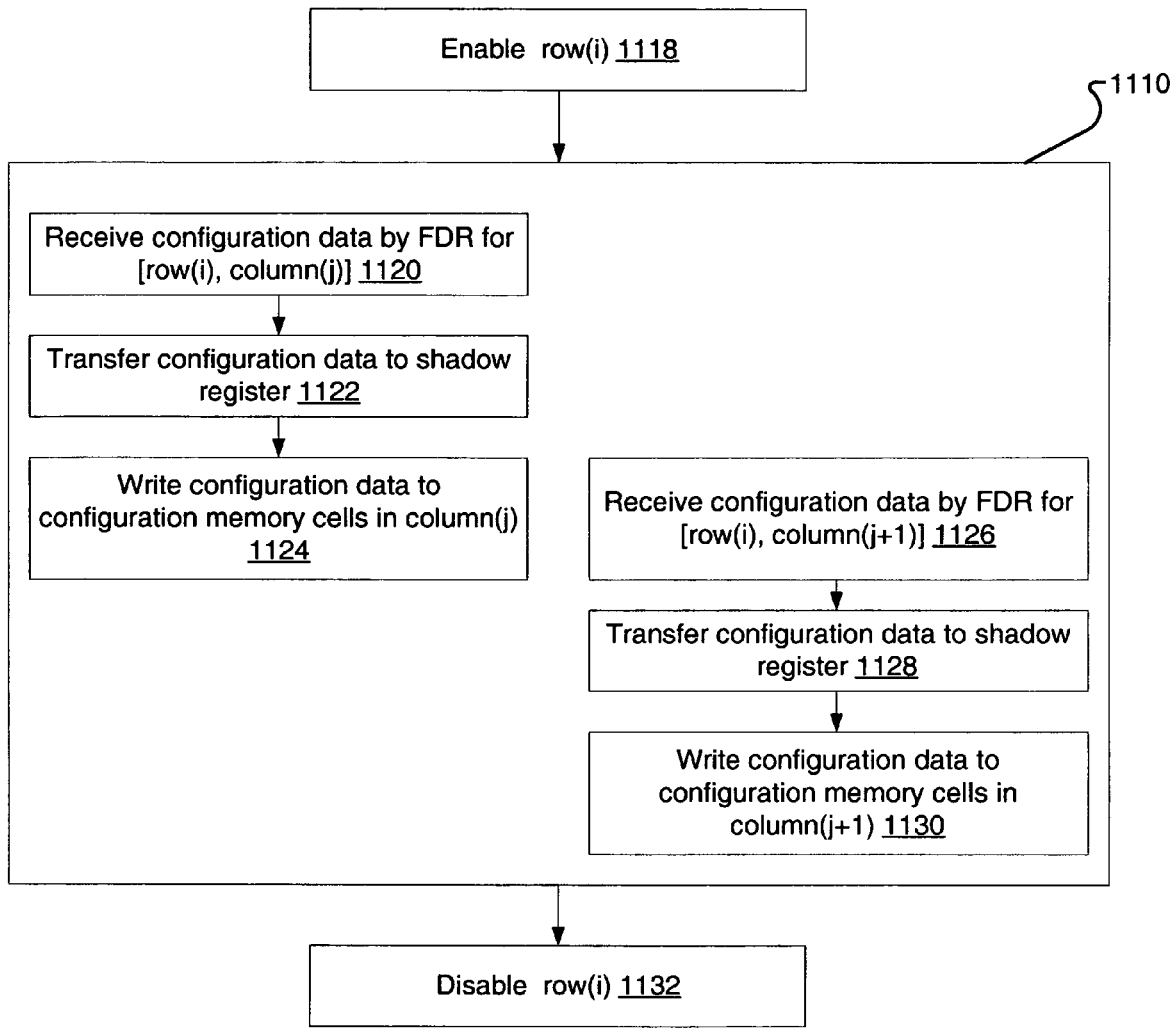
FIG. 14 is a block diagram of a process for writing to configuration memory cells in two columns of a row(i) of an embodiment of the present invention.

FIG. 14 is a block diagram of a process for writing to configuration memory cells in two columns of a row(i) of an embodiment of the present invention. Again for simplicity it is assumed that fdr_addr is the same as row_addr. At step 1118, row(i) is enabled (fdr_addr and row_addr are asserted). Block 1110 shows a pipeline process where steps 1120-1124 are done concurrently with steps 1126-1130. At step 1120 FDR receives serially, e.g., by word, from the configuration center configuration data for columns) of row(i). At step 1122 the configuration data is transferred from the FDR to the shadow register in parallel, e.g., by word. Next at step 1124, the configuration data is written in parallel, e.g., by word, to the configuration memory cells in columns). Concurrently, with the execution of step 1124, step 1126 receives new configuration data serially, e.g., by word, from the configuration center for column(j+1) of the same row(i). At step 1128 the configuration data is transferred in parallel, e.g., by word, from the FDR to the shadow register. Next, at step 1130, the configuration data is written to the configuration memory cells in parallel, e.g., by word, in column(j+1). Not shown is that while step 1130 is happening, FDR is again concurrently receiving configuration data for column(j+2) of row(i), and so forth. When all columns in row(i) have been written to, row(i) is disabled (fdr_addr and row_addr are deasserted). In other embodiments, transfers are done in parallel by other groups of bits, e.g., single bits, bytes, half-words, double words, or any combination thereof, rather than by words.

In one embodiment of the present invention, the FDR(i) address (fdr_addr) and the row(i) address (row_addr) are two separate but related signals. In writing to the configuration memory, fdr_addr leads row_addr and in reading from configuration memory fdr_addr lags row_addr. As an example, row(i) and row(i+1) are examined, for columns 1 to M. Also, let FDR have K number of words. First, for row(i), fdr_addr(i) is asserted and K words are serially read into FDR(i). The write process continues: the K words are transferred in parallel from FDR(i) to shadow_register(i); row_addr(i) is asserted; the K words are transferred in parallel from the shadow register to column(j); j is incremented; K new words are read serially into FDR(i) (with fdr_addr and row_addr still asserted); the K words are transferred in parallel to the shadow register(i); the K words are written in parallel to column(j); and the process repeated for a total of M−1 times. On the last (Mth) iteration, fdr_addr(i) is deasserted after the K words for column(M) are serially read into FDR(i) and then in parallel transferred to shadow_register(i). Concurrently with fdr_addr(i) being deasserted, fdr_addr(i+1) is asserted indicating a write of K new words to the next row FDR(i+1) from the configuration center. When the K words have been written from the shadow_register(i) to column(M), row_addr(i) is deasserted and concurrently, row_addr(i+1) is asserted and the K new words in shadow_register(i+1) are written to column(1) of row(i+1).

Reading from the configuration memory is substantially the reverse of writing procedure. First for row(i), row_addr (i) is asserted and K words are read into shadow_register(i) from columns). Next fdr_addr(i) is asserted and the K words are transferred from shadow_register(i) to FDR(i). The K words are then serially transferred from the FDR(i) to the configuration center. The read process continues by: j being incremented; K new words are read into shadow_register(i) (with fdr_addr and row_addr still asserted) from column(j+ 1), the K words are transferred to FDR(i); the K words are serially written to the configuration center; and the process is repeated for a total of M−1 times. On the last (Mth) iteration, row_addr(i) is deasserted after the K words for column(M) are read by shadow_register(i) and transferred to FDR(i). Concurrently with row_addr(i) being deasserted, row_addr(i+1) is asserted indicating a read for the next row. When the K words have been read from FDR(i) to the configuration center, fdr_addr(i) is deasserted and concurrently, fdr_addr(i+1) is asserted.

While the above functionality has generally been described in terms of specific hardware and software, it would be recognized that the invention has a much broader range of applicability. For example, the software functionality can be further combined or even separated. Similarly, the hardware functionality can be further combined, or even separated. The software functionality can be implemented in terms of hardware or a combination of hardware and software. Similarly, the hardware functionality can be implemented in software or a combination of hardware and software.

Although the invention has been described in connection with several embodiments, it is understood that this invention is not limited to the embodiments disclosed, but is capable of various modifications, which would be apparent to one of ordinary skill in the art. Thus, the invention is limited only by the following claims.

What is claimed is:

1. A system for programming configuration memory cells in a programmable logic device comprising:
   a plurality of groups of configuration memory cells arranged in a plurality of rows and a plurality of columns, a group of the plurality of groups for storing a fixed length frame, the group associated with a row address and a column address;
   a plurality of column address decoder circuits, each column address decoder circuit associated with a row of the plurality of rows, wherein a column address decoder circuit of the plurality of column address decoder circuits is configured to produce the column address for the group; and
   a plurality of frame data registers, each frame data register comprising a plurality of data registers, wherein a frame data register of the plurality of frame data registers is configured to store the fixed length frame.

2. The system of claim 1 further comprising a frame data register address signal for determining the frame data register and a row address signal for determining the row address.

3. The system of claim 2 wherein the frame data register address signal and the row address signal are operably the same.

4. The system of claim 2 wherein the frame data register address signal comprises a first one-hot signal and the row address signal comprises a second one-hot signal.

5. The system of claim 1 further comprising a plurality of one-hot frame data register address signals and a plurality of one-hot frame row address signals wherein a first layout of the one-hot frame data register address signals is coupled to a rotated version of the first layout and wherein a second layout of the one-hot row address signals is coupled to a rotated version of the second layout.

6. The system of claim 1 wherein each column address decoder circuit is further associated with a hclk row of a H clock tree.

7. The system of claim 1 further comprising: a plurality of column driver circuits, a column driver circuit of the plurality of column driver circuits associated with a column of the plurality of columns.

8. The system of claim 1 further comprising a plurality of shadow data registers coupled to the plurality of frame data registers, each shadow data register for receiving contents of an associated frame data register in a write operation or for sending contents to the associated frame data register in a read operation.

9. The system of claim 1 wherein a frame data register comprises N data registers, each of the N data registers storing a word of 32 bits.

10. The system of claim 9 wherein N is 41.

11. The system of claim 1 further comprising a plurality of serially connected logic circuits, each logic circuit connected to a corresponding frame data register.

12. The system of claim 11 wherein a logic circuit of the plurality of serially connected logic circuits comprises an OR gate receiving the outputs of two AND gates, wherein one AND gate has a clock enable signal as an input.

13. The system of claim 1 further comprising a plurality of row control circuits, a row control circuit of the plurality of row control circuits configured to receive a one-hot row address signal and to control reading to or writing from the group.

14. The system of claim 13 wherein the row control circuit comprises a control circuit having some control inputs gated with the one-hot row address signal.

15. The system of claim 1 wherein the plurality of groups of configuration memory cells comprises volatile memory, non-volatile memory or a combination thereof.

16. The system of claim 1 wherein
   the plurality of column address decoder circuits comprises a plurality of distributed column address decoders, a column address decoder of the plurality of distributed column address decoders configured to decode the column address.

* * * * *